(12) United States Patent
Chiang et al.

(10) Patent No.: US 12,396,195 B2
(45) Date of Patent: Aug. 19, 2025

(54) HIGH ELECTRON MOBILITY TRANSISTOR DEVICE AND MANUFACTURING METHOD THEREOF

(71) Applicant: United Microelectronics Corp., Hsinchu (TW)

(72) Inventors: Huai-Tzu Chiang, Tainan (TW); Kai Lin Lee, Kinmen County (TW); Zhi-Cheng Lee, Tainan (TW); Chuang-Han Hsieh, Tainan (TW)

(73) Assignee: United Microelectronics Corp., Hsinchu (TW)

(*) Notice: Subject to any disclaimer, the term of this patent is extended or adjusted under 35 U.S.C. 154(b) by 522 days.

(21) Appl. No.: 17/864,325

(22) Filed: Jul. 13, 2022

(65) Prior Publication Data

US 2023/0402537 A1 Dec. 14, 2023

(30) Foreign Application Priority Data

Jun. 14, 2022 (CN) .......................... 202210672388.4

(51) Int. Cl.
*H10D 30/47* (2025.01)
*H10D 30/01* (2025.01)

(52) U.S. Cl.
CPC ......... *H10D 30/475* (2025.01); *H10D 30/015* (2025.01)

(58) Field of Classification Search
CPC ............... H10D 30/475; H10D 30/015; H10D 62/8503; H10D 64/111; H10D 64/256; H10D 62/85; H10D 62/402; H10D 62/343; H10D 62/102; H10D 62/40
See application file for complete search history.

(56) References Cited

U.S. PATENT DOCUMENTS

| 11,031,493 | B2 | 6/2021 | Shrivastava et al. |
| 2017/0301772 | A1* | 10/2017 | Radway ............ H10D 62/8503 |
| 2023/0170389 | A1* | 6/2023 | Lin ..................... H10D 62/824 257/76 |

* cited by examiner

*Primary Examiner* — Thanh T Nguyen
(74) *Attorney, Agent, or Firm* — JCIPRNET

(57) ABSTRACT

A high electron mobility transistor (HEMT) device includes a substrate, a channel layer, a source, a drain, a buffer layer, and a plurality of amorphous regions. The channel layer is located above the substrate. The source is located on the channel layer. The drain is located on the channel layer. The buffer layer is located between the substrate and the channel layer. The plurality of amorphous regions are located in the buffer layer below the source and the drain.

7 Claims, 10 Drawing Sheets

HIGH ELECTRON MOBILITY TRANSISTOR DEVICE AND MANUFACTURING METHOD THEREOF

CROSS-REFERENCE TO RELATED APPLICATION

This application claims the priority benefit of China patent application no. 202210672388.4, filed on Jun. 14, 2022. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to a high electron mobility transistor (HEMT) device and a manufacturing method thereof.

Description of Related Art

In semiconductor techniques, Group III-V semiconductor compounds may be used to form various integrated circuit devices such as high-power field-effect transistors, high-frequency transistors, or high electron mobility transistors (HEMTs). HEMTs are field-effect transistors with a two-dimensional electron gas (2DEG) layer adjacent to the junction between two materials with different energy gaps (i.e., heterojunction). Since HEMTs do not use the doped region as the carrier channel of the transistor, but use the 2DEG layer as the carrier channel of the transistor, compared to conventional MOSFETs, HEMTs have several attractive properties, such as high electron mobility and the ability to transmit signals at high frequencies. However, conventional HEMTs also have larger gate leakage currents and lower breakdown voltages, so improvements are still needed.

SUMMARY OF THE INVENTION

In some embodiments of the invention, a high electron mobility transistor (HEMT) device includes a substrate, a channel layer, a source, a drain, a buffer layer, and a plurality of amorphous regions. The channel layer is located above the substrate. The source is located on the channel layer. The drain is located on the channel layer. The buffer layer is located between the substrate and the channel layer. The plurality of amorphous regions are located in the buffer layer below the source and the drain.

In some embodiments of the invention, a manufacturing method of a high electron mobility transistor device includes the following steps. A substrate is provided. A buffer layer is formed on the substrate. A channel layer is formed on the buffer layer. A plurality of amorphous regions are formed in the buffer layer. A dielectric structure is formed above the channel layer. A source and a drain are formed on the channel layer above the plurality of amorphous regions and located on the channel layer.

Based on the above, in some embodiments of the invention, the plurality of amorphous regions formed in the buffer layer are located below the channel layer and correspond to the source and the drain to block leakage current path and reduce leakage current.

DESCRIPTION OF THE EMBODIMENTS

Figure 1:
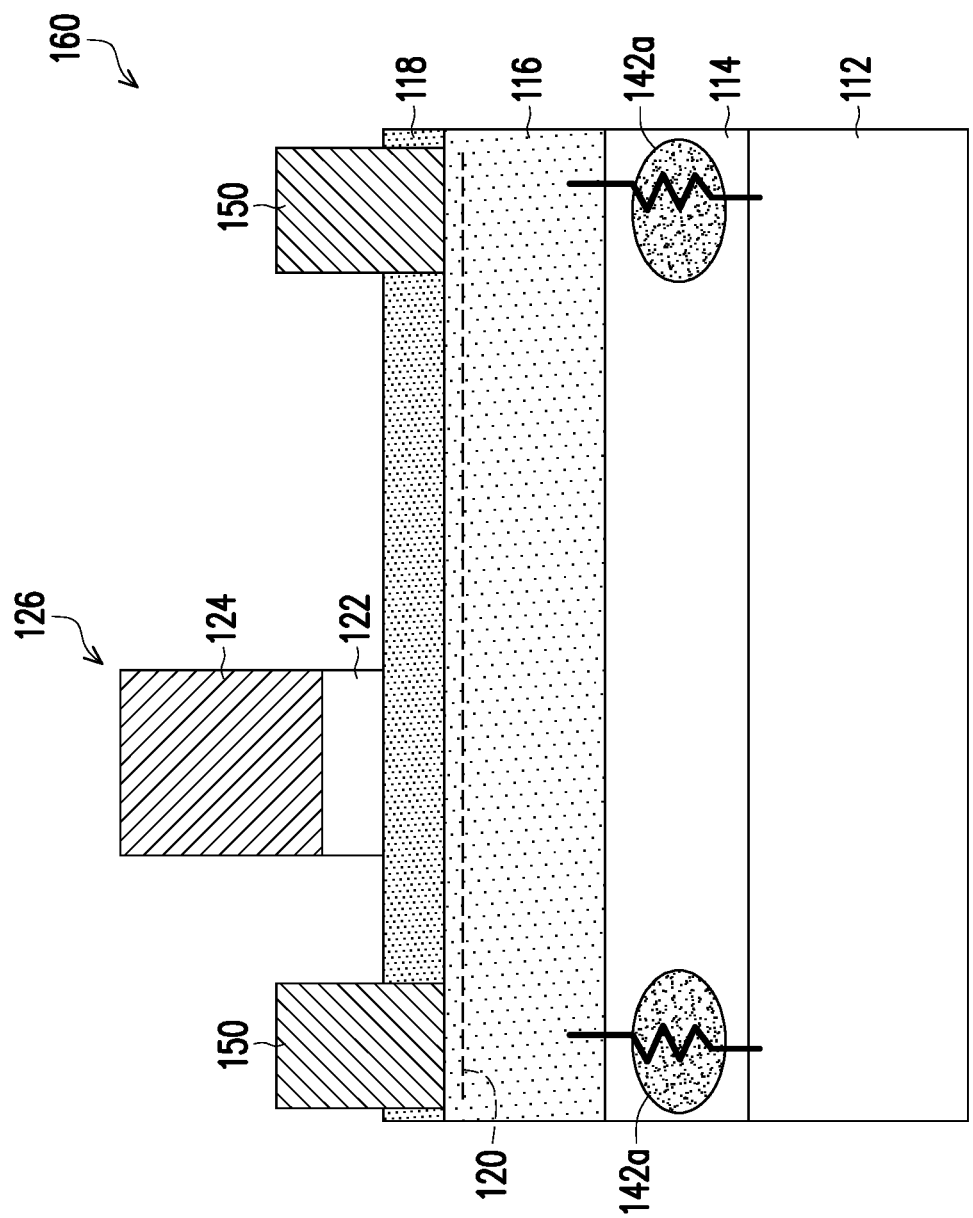
FIG. 1 is a schematic cross-sectional view of a high electron mobility transistor device according to some embodiments of the invention.

FIG. 1 is a schematic cross-sectional view of a high electron mobility transistor device according to some embodiments of the invention.

Referring to FIG. 1, a high electron mobility transistor device 160 of some embodiments of the invention is, for example, a high electron mobility transistor. The high electron mobility transistor device 160 includes a substrate 112, a buffer layer 114, a channel layer 116, a barrier layer 118, a gate structure 126, and a source and drain 150.

The substrate 112 may be, for example, a monocrystalline substrate. The material of the substrate 112 includes a semiconductor, such as silicon, silicon carbide, or aluminum oxide (also referred to as sapphire). The substrate 112 may be a single-layer substrate, a multi-layer substrate, a gradient substrate, or a combination thereof. According to other embodiments of the invention, the substrate 112 may be a silicon-on-insulator (SOI) substrate. In some embodiments, the substrate 112 includes (111) monocrystalline silicon.

The buffer layer 114 is located on the substrate 112. The buffer layer 114 may reduce stress between the substrate 112 and the channel layer 116. In an embodiment, the buffer layer 114 is optional and may be omitted. The buffer layer 114 may be a single layer or a plurality of layers. The buffer layer 114 is, for example, a doped III-V semiconductor, such as carbon-doped gallium nitride (C-doped GaN).

The channel layer 116 is formed on the buffer layer 114. In some embodiments without the buffer layer 114, the channel layer 116 is formed directly on the substrate 112. The channel layer 116 is, for example, an undoped III-V semiconductor, such as undoped gallium nitride (undoped GaN).

The barrier layer 118 is located on the channel layer 116. A heterojunction of two-dimensional electron gases (2DEG) (represented by a dashed line 120) is in the channel layer 116 adjacent to the interface between the barrier layer 118 and the channel layer 116. The barrier layer 118 may be a single layer or a plurality of layers. The barrier layer 118 is, for example, a group III-V semiconductor, such as aluminum gallium nitride ($Al_xGa_{1-x}N$), wherein $0>x>1$, and x is between 16% and 30%.

The gate structure 126 is located on the barrier layer 118. The gate structure 126 includes a polarization adjustment layer 122 and a gate conductor layer 124. The polarization adjustment layer 122 may adjust the dipole content in the barrier layer 118 to cause changes in the 2-DEG 20 concentration. Generally, the polarization adjustment layer 122 is formed for an enhancement-mode (normally off) AlGaN/GaN HEMT, and a polarization adjustment layer is not needed in a depletion-mode (normally on) AlGaN/GaN HEMT. The polarization adjustment layer 122 is, for example, a P-type doped III-V semiconductor, such as P-type doped gallium nitride (P-typed-GaN). The P-type dopant is, for example, boron or boron trifluoride.

The gate conductor layer 124 is located on the polarization adjustment layer 122. The gate conductor layer 124 includes a metal or an alloy thereof, such as gold, silver, platinum, titanium, aluminum, tungsten, palladium, copper, or a combination thereof. The gate conductor layer 124 may be a single layer or a plurality of layers. In some embodiments, the gate conductor layer 124 includes a Schottky metal. The gate conductor layer 124 is, for example, a titanium/aluminum copper/titanium (TiN/AlCu/TiN) metal stack.

The source and drain 150 are located at two sides of the gate structure 126. The source and drain 150 include a metal or an alloy thereof, such as gold, silver, platinum, titanium, aluminum, tungsten, palladium, copper, or a combination thereof. The source and drain 150 may be a single layer or a plurality of layers. In some embodiments, the source and drain 150 include an ohmic contact metal. So far, the manufacture of the high electron mobility transistor device 160 is completed. The high electron mobility transistor device 160 is, for example, a GaN HEMT.

Below the source and drain 150 is the channel layer 116. The channel layer 116 has the heterojunction 120 of a two-dimensional electron gas. Below the channel layer 116 is a corresponding amorphous region 142a. The amorphous region 142a is sandwiched between the channel layer 116 and the substrate 112. Compared with the crystalline regions of the channel layer 116 and the buffer layer 114, since the amorphous region 142a of the channel layer 116 and the buffer layer 114 has more grain boundaries and has higher resistance values than the surrounding crystalline regions of the buffer layer 114, the conductor device 160 is less likely to generate leakage current during operation. In other words, the amorphous region 142a may be used as a blocking region to reduce the leakage current of the high electron mobility transistor device 160.

FIG. 2A to FIG. 2H are schematic cross-sectional views of a manufacturing process of a high electron mobility transistor device according to some embodiments of the invention.

Figure 2A:
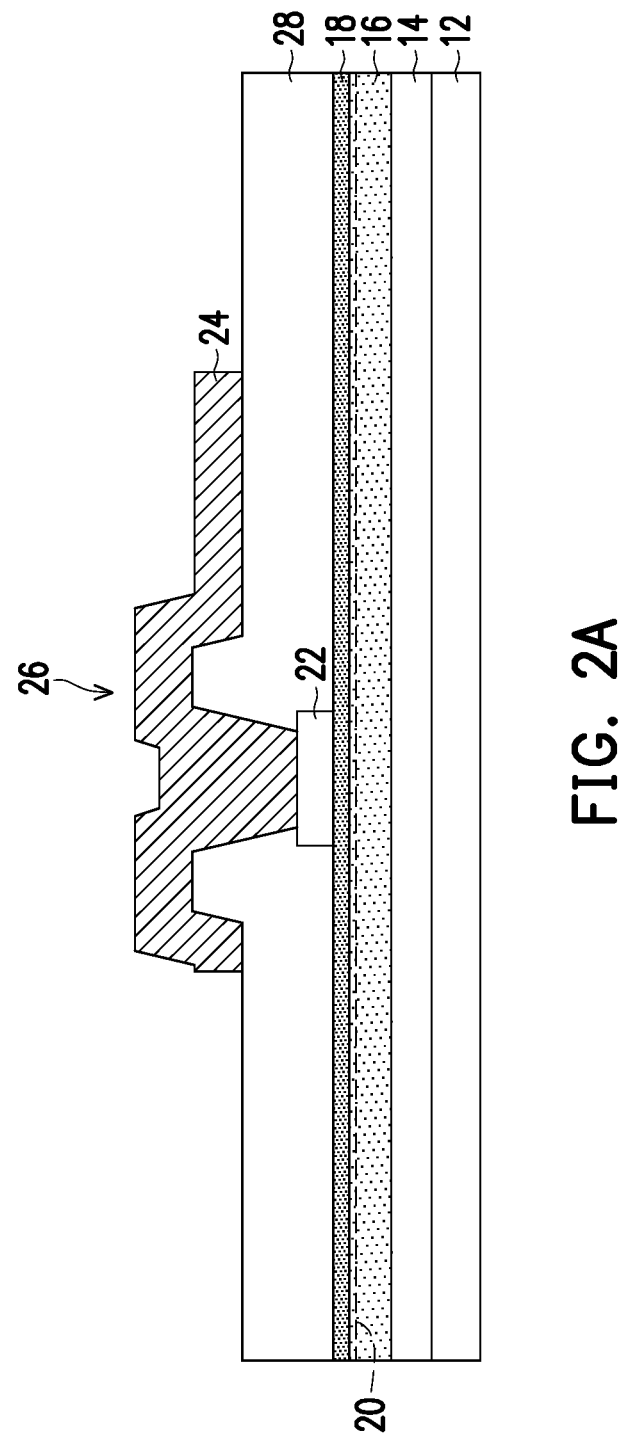
FIG. 2A to FIG. 2H are schematic cross-sectional views of a manufacturing process of a high electron mobility transistor device according to some embodiments of the invention.

First, referring to FIG. 2A, a substrate 12 is provided. The substrate 12 may be a monocrystalline substrate. The material of the substrate 12 includes a semiconductor, such as silicon, silicon carbide, or aluminum oxide (also referred to as sapphire). The substrate 12 may be a single-layer substrate, a multi-layer substrate, a gradient substrate, or a combination thereof. According to other embodiments of the invention, the substrate 12 may be a silicon-on-insulator (SOI) substrate. In some embodiments, the substrate 12 includes (111) monocrystalline silicon.

Then, a buffer layer 14 is formed on the substrate 12. The buffer layer 14 may reduce the stress between the substrate 12 and the channel layer 16 formed subsequently. In an embodiment, the buffer layer 14 and operating steps are optional and may be omitted. The buffer layer 14 may be a single layer or a plurality of layers. The buffer layer 14 is, for example, a doped III-V semiconductor, such as carbon-doped gallium nitride (C-doped GaN). In some embodiments, the dopant (e.g., carbon) of the buffer layer 14 may be formed in-situ during the process of forming the gallium nitride. The buffer layer 14 may be formed by an epitaxial growth process. In some embodiments, the buffer layer 14 may be formed by a molecular-beam epitaxy (MBE) process, a metal organic chemical vapor deposition (MOCVD) process, a chemical vapor deposition (CVD) process, or a hydride vapor phase epitaxy (HVPE) process.

Subsequently, the channel layer 16 is formed on the buffer layer 14. In some embodiments without the buffer layer 14, the channel layer 16 is formed directly on the substrate 12. The channel layer 16 is, for example, an undoped III-V semiconductor, such as undoped gallium nitride (undoped GaN). The channel layer 16 is not doped during the forming process, but the resulting undoped III-V semiconductor may have a little impurity due to residual substances in the process tool. The channel layer 16 may be formed by an epitaxial growth process. In some embodiments, the channel layer 16 may be formed using an MBE process, an MOCVD process, a CVD process, or an HVPE process.

Next, a barrier layer 18 is formed on the channel layer 16. A heterojunction of two-dimensional electron gases (2DEG) (represented by a dashed line 20) is in the channel layer 16 adjacent to the interface between the barrier layer 18 and the channel layer 16. The barrier layer 18 may be a single layer or a plurality of layers. The barrier layer 18 is, for example, a group III-V semiconductor, such as aluminum gallium nitride (AlxGa1-xN), wherein 0>x>1, and x is between 16% and 30%. The barrier layer 18 may be formed by an epitaxial growth process. In some embodiments, the channel layer 16 may be formed using an MBE process, an MOCVD process, a CVD process, or an HVPE process.

A gate structure 26 is formed on the barrier layer 18. The gate structure 26 includes a polarization adjustment layer 22 and a gate conductor layer 24. The polarization adjustment layer 22 may adjust the dipole content in the barrier layer 18 to cause changes in the 2-DEG 20 concentration. Generally, the polarization adjustment layer 22 is formed for an enhancement-mode (normally off) AlGaN/GaN HEMT, and a polarization adjustment layer is not needed in a depletion-mode (normally on) AlGaN/GaN HEMT. The polarization adjustment layer 22 is, for example, a P-type doped III-V semiconductor, such as P-type doped gallium nitride (P-type-doped GaN). The P-type dopant is, for example, boron or boron trifluoride. In some embodiments, the P-type dopant of the polarization adjustment layer 22 may be formed in-situ during the process of forming gallium nitride. The polarization adjustment layer 22 may be formed by first forming a gate dielectric material, and then performing a patterning process. The polarization adjustment layer 22 may be a P-type-doped epitaxial layer formed by an epitaxial growth process. The epitaxial growth process is, for example, an MBE process, an MOCVD process, a CVD process, or an HVPE process. In some embodiments, the polarization adjustment layer 22, the barrier layer 18, the channel layer 16, and the buffer layer 14 may be formed in-situ. The patterning process is, for example, a lithography and etching process. The etching process may be dry etching, wet etching, or a combination thereof.

In some embodiments, after the polarization adjustment layer 22 is formed, a dielectric layer 28 is first formed to cover the polarization adjustment layer 22 and the barrier layer 18. The material of the dielectric layer 28 includes silicon oxide, silicon nitride, silicon oxynitride, carbon-doped silicon oxide, carbon-doped silicon nitride, carbon-doped silicon oxynitride, zinc oxide, zirconium oxide, hafnium oxide, titanium oxide, or another suitable material. In some embodiments, the dielectric layer 28 is, for example, silicon oxide, and is formed by a method such as plasma-enhanced chemical vapor deposition. The gas used in the plasma-enhanced chemical vapor deposition method is, for example, tetraethoxysiloxane (TEOS). In some embodiments, a planarization process, such as a chemical-mechanical planarization (CMP) process, may be performed after the deposition of the dielectric layer 28 to planarize the dielectric layer 28.

Next, via a lithography and etching process, the dielectric layer 28 is patterned to form an opening (not shown) in the dielectric layer 28. The opening exposes the polarization adjustment layer 22. Then, a gate conductor material is formed on the dielectric layer 28, and then the gate conductor material is patterned via a lithography and etching process to form the gate conductor layer 24. The gate conductor layer 24 is located on the polarization adjustment layer 22. The gate conductor material includes a metal. The gate conductor material is, for example, gold, silver, platinum, titanium, aluminum, tungsten, palladium, or a combination thereof. The gate conductor material may be a single layer or a plurality of layers. In some embodiments, the gate conductor material includes a Schottky metal. The gate conductor material is, for example, a titanium/aluminum copper/titanium (TiN/AlCu/TiN) metal stack. The gate conductor material may be formed by, for example, an electroplating process, a sputtering process, a resistance heating evaporation process, an electron beam evaporation process, a physical vapor deposition (PVD) process, or a chemical vapor deposition (CVD) process.

Figure 2B:
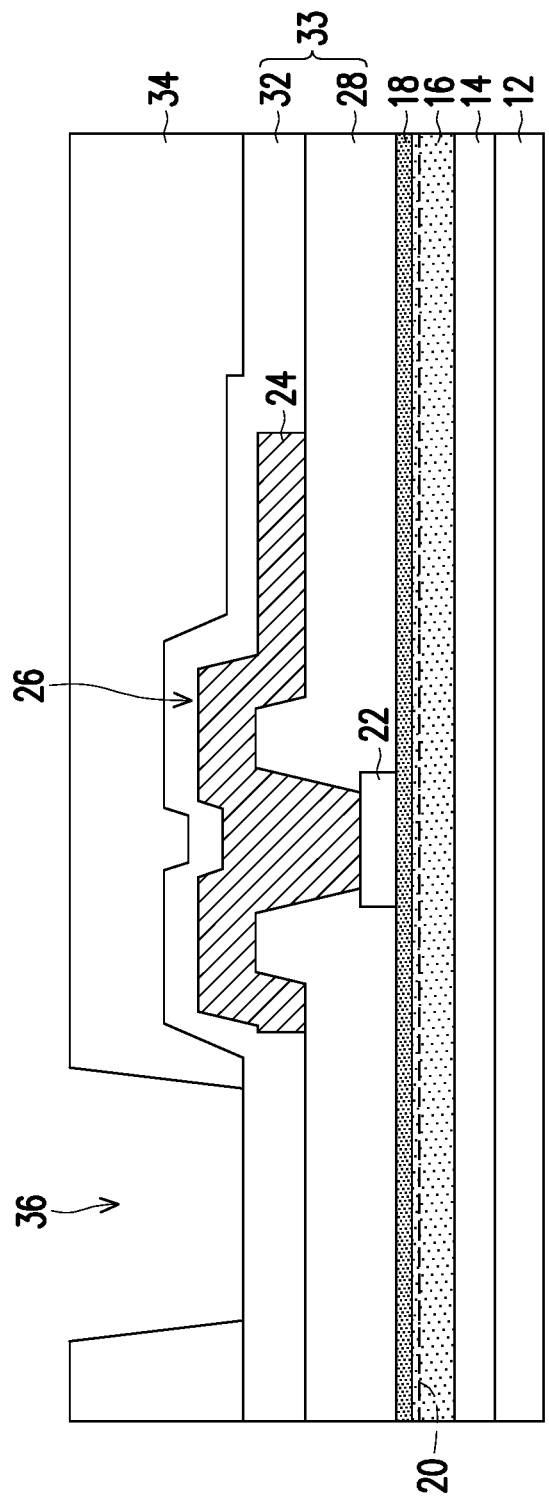

Referring to FIG. 2B, then, a dielectric layer 32 is formed on the gate conductor layer 24 and the dielectric layer 28. The dielectric layer 32 may also be referred to as a passivation layer. The dielectric layer 32 and the dielectric layer 28 may be collectively referred to as a dielectric structure. The material of the dielectric layer 32 includes silicon oxide, silicon nitride, silicon oxynitride, carbon-doped silicon oxide, carbon-doped silicon nitride, carbon-doped silicon oxynitride, zinc oxide, zirconium oxide, hafnium oxide, titanium oxide, or another suitable material. In some embodiments, the material of the dielectric layer 32 is, for example, silicon oxide, and is formed by a method such as plasma-enhanced chemical vapor deposition. The gas used in the plasma-enhanced chemical vapor deposition method is, for example, tetraethoxysiloxane (TEOS). Then, a mask layer 34 is formed on the dielectric layer 32. The mask layer 34 has a plurality of openings 36 exposing the dielectric layer 32. The mask layer 34 is, for example, a patterned photoresist layer. The patterned photoresist layer may be formed by exposing and developing a positive photoresist or a negative photoresist.

Figure 2C:
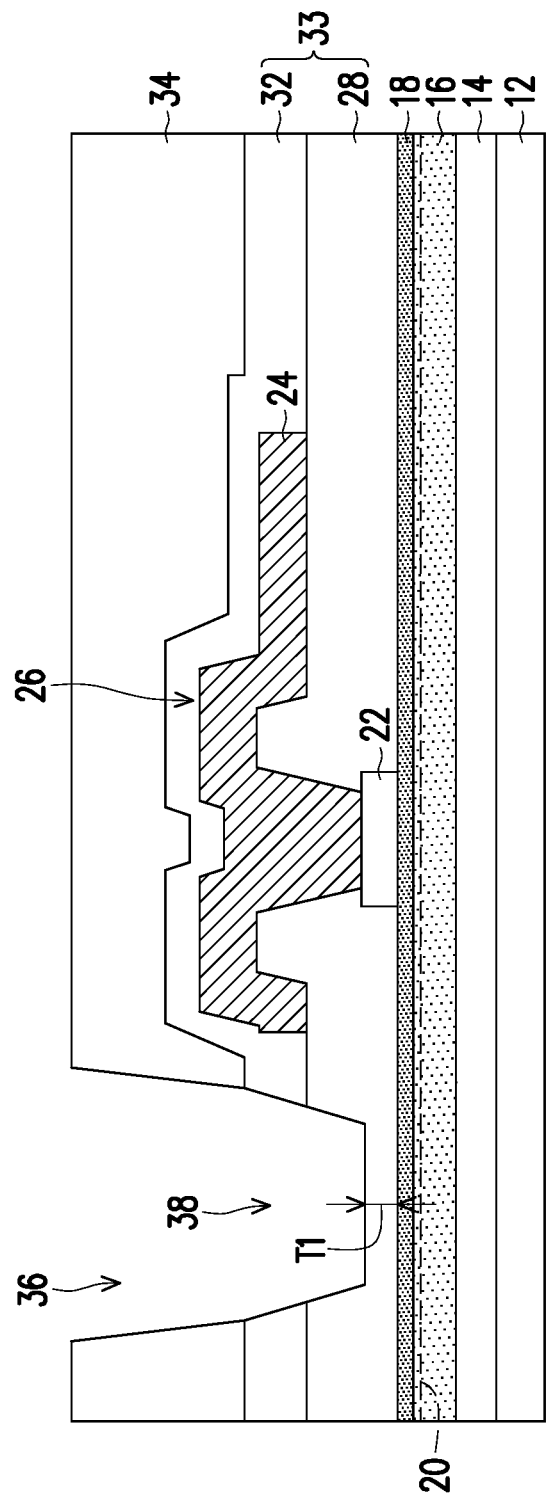

Referring to FIG. 2C, using the mask layer 34 as a mask, an etching process is performed to remove a portion of the dielectric layers 32 and 28 to form an opening 38. The position of the opening 38 corresponds to a subsequently formed source and drain 50 (shown in FIG. 2H). In some embodiments, the bottom of the opening 38 exposes a portion of the dielectric layer 28. A thickness T1 of the dielectric layer 28 remaining at the bottom of the opening 38 is, for example, 50 nm to 100 nm.

Figure 2D:
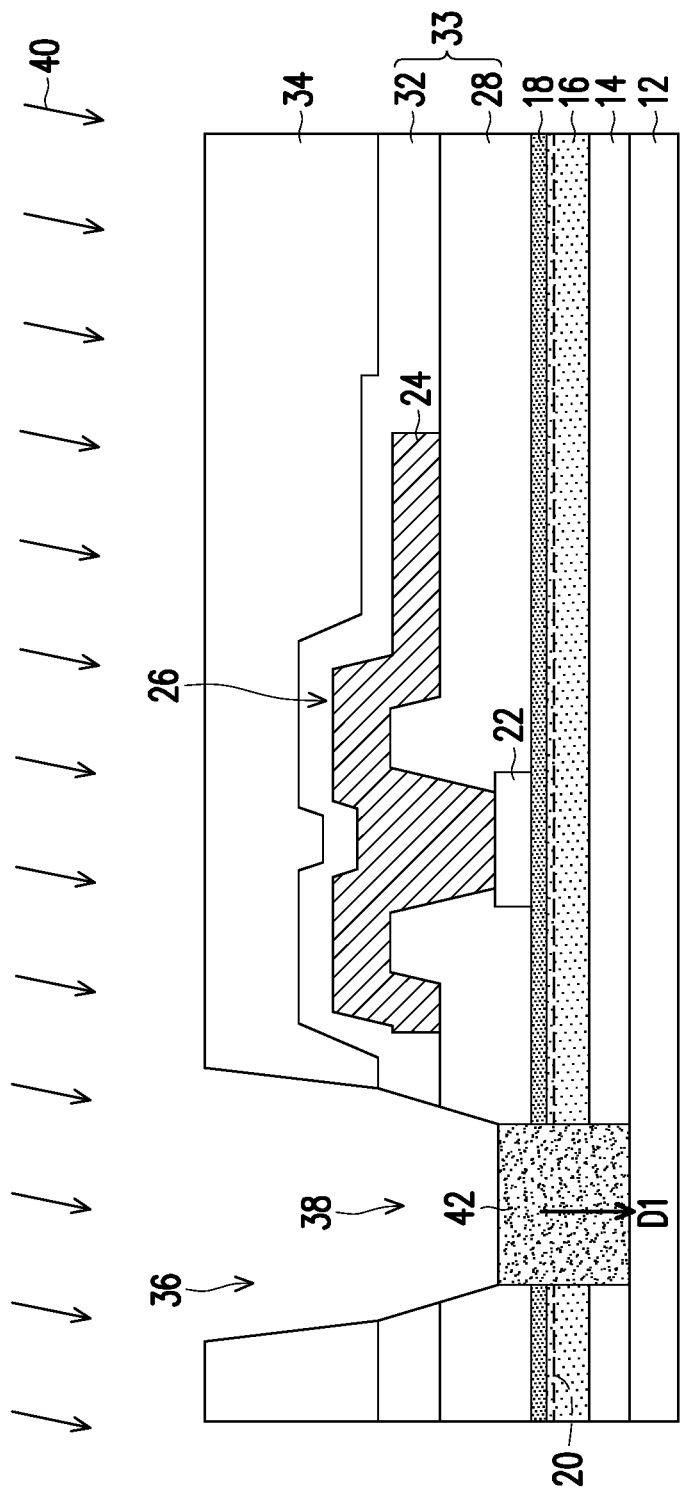

Referring to FIG. 2D, a treatment process 40 is performed to form a treatment region 42 below each of the openings 38. The treatment region 42 may be extended through the barrier layer 18 from the dielectric layer 28 below the openings 38 to the bottom of the channel layer 16. In some embodiments, the treatment region 42 is extended from the dielectric layer 28 below the openings 38 all the way to the buffer layer 14. The treatment process 40 is, for example, an amorphization process. The amorphization process is, for example, an ion implantation process. The gas of the ion implantation process includes an inert gas, such as argon. The energy of the ion implantation process is, for example, 70 keV to 100 keV, and the dose is, for example, $5\times10^{13}/cm^2$ to $5\times10^{14}/cm^2$. In other words, the treatment region 42 of the barrier layer 18, the channel layer 16, and the buffer layer 14 is an amorphous region. Since the crystals of the barrier layer 18, the channel layer 16, and the buffer layer 14 are destroyed and become amorphous, the treatment region 42 may also be referred to as a damaged region. Subsequently, the treatment region 42 undergoes a thermal process 44, as shown in FIG. 2F.

Figure 2E:
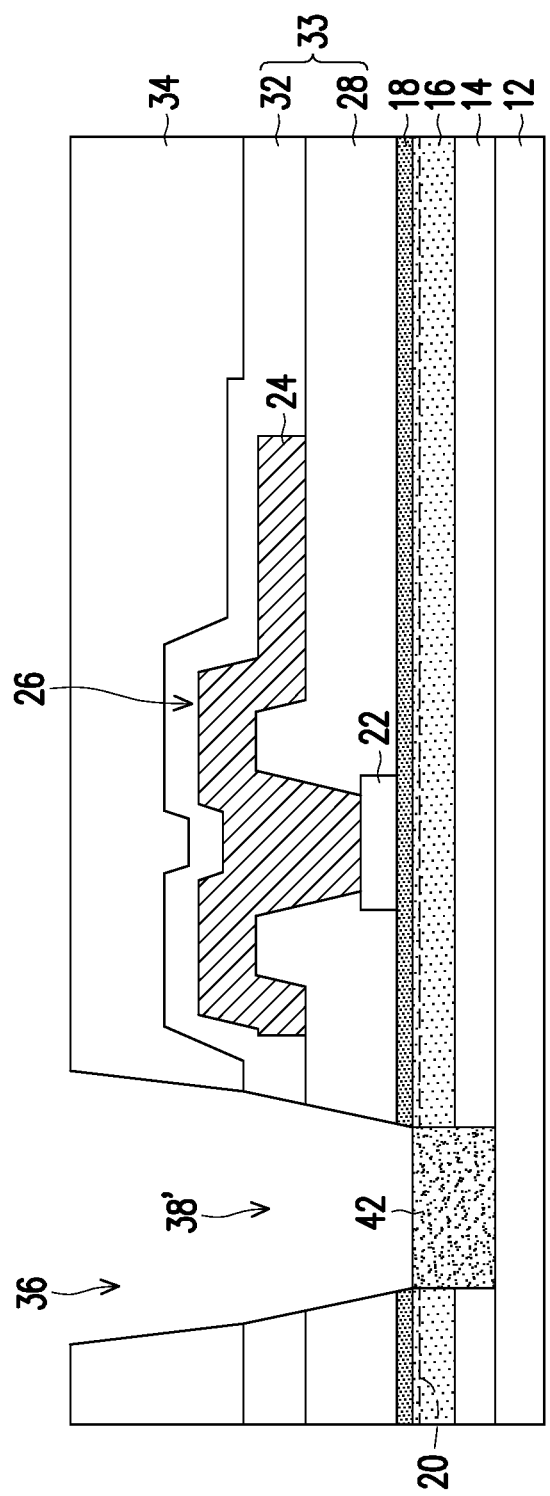
Figure 2F:
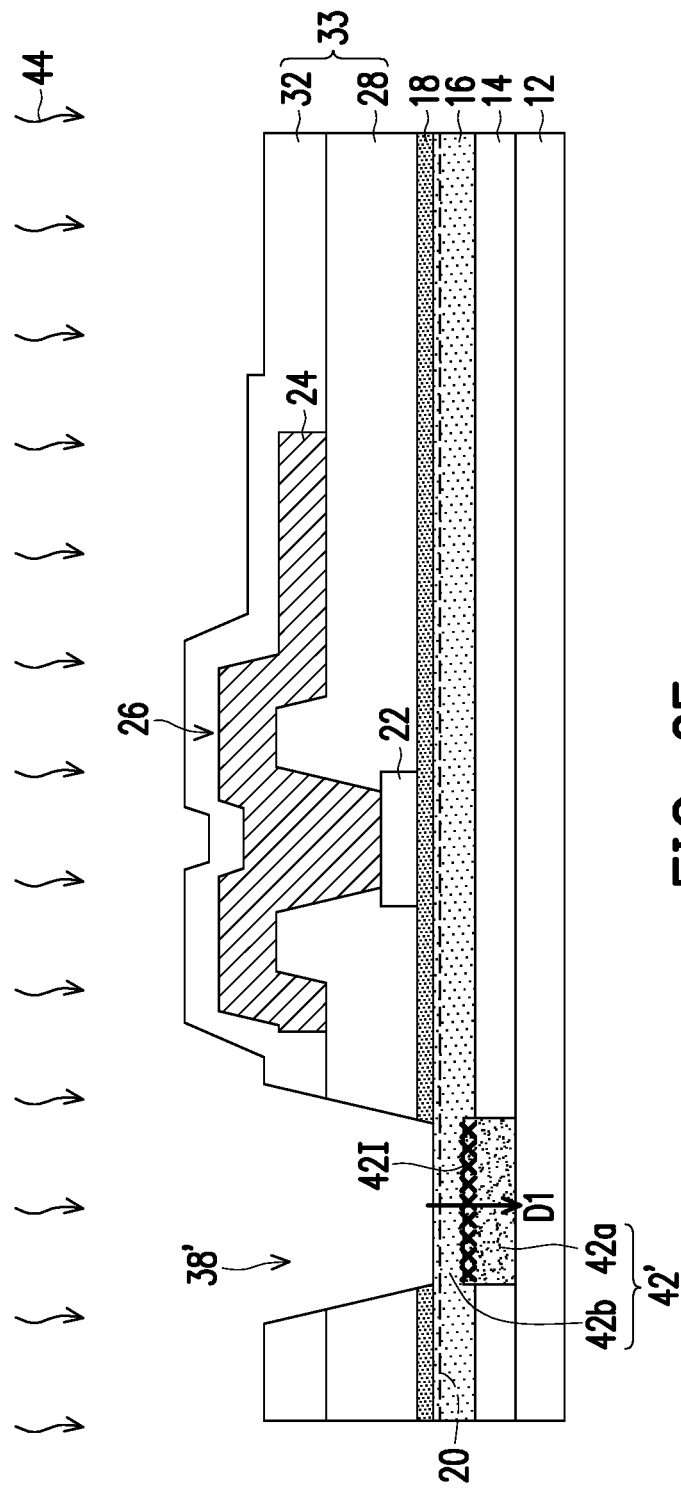
Figure 2G:
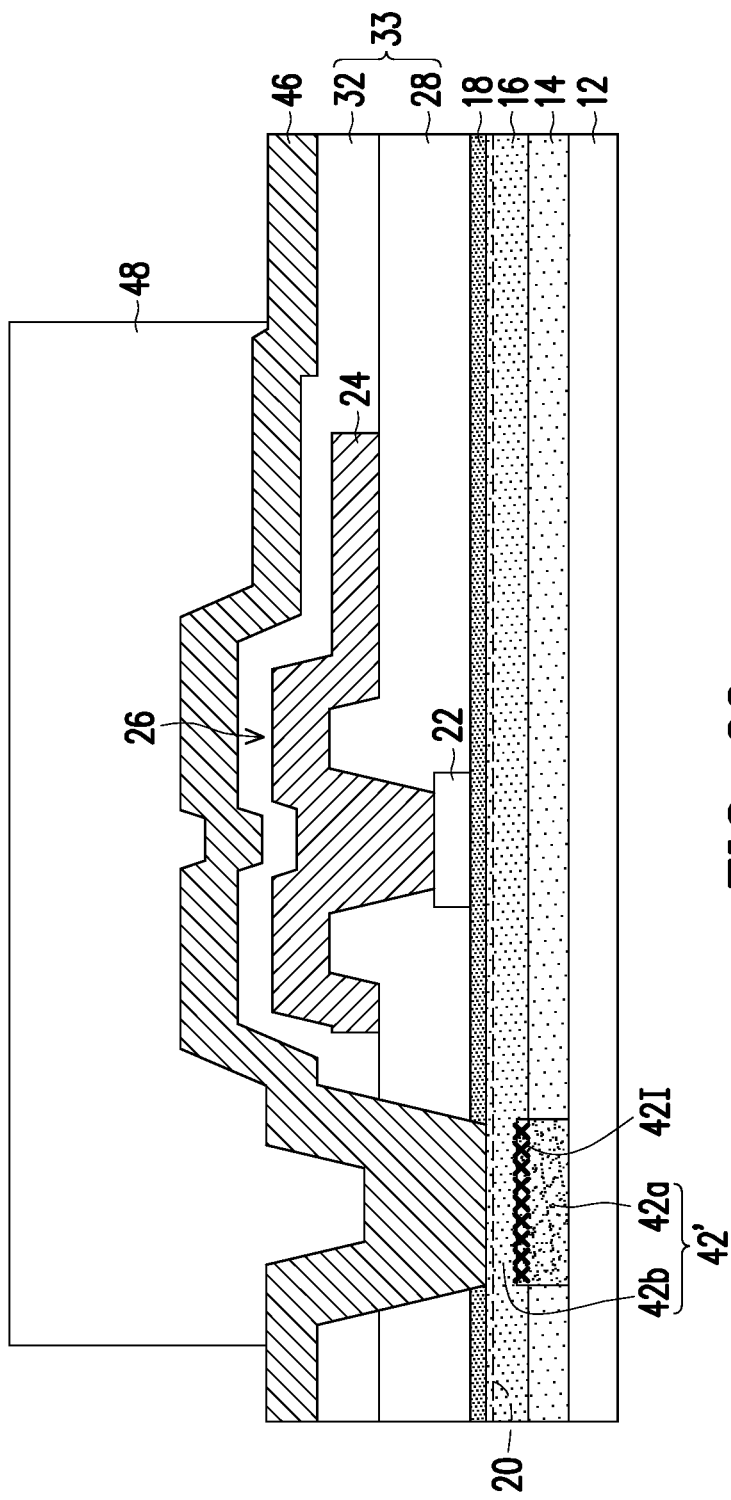
Figure 2H:
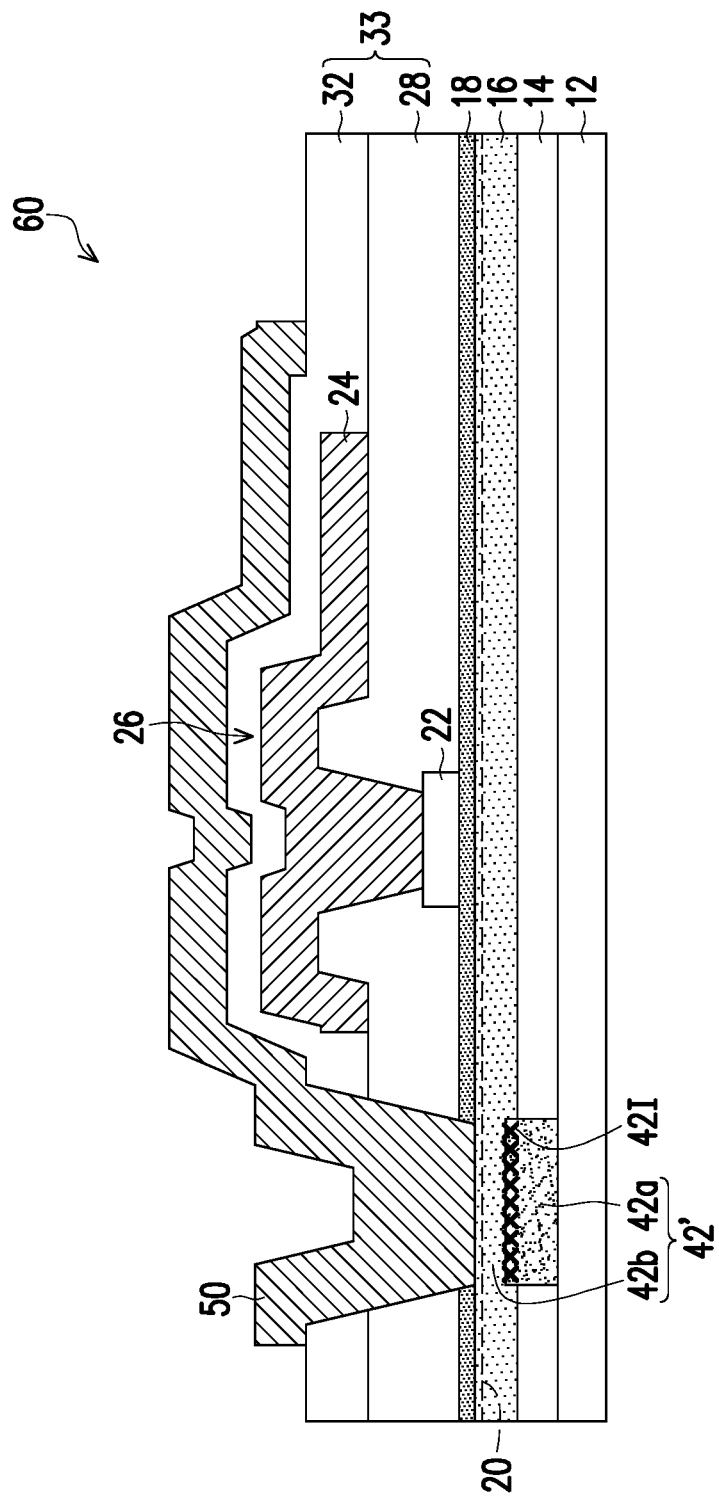

Since the source and drain 50 (as shown in FIG. 2H) are formed in the openings 38 (or 38'), and the treatment region 42 adopts the mask layer 34 forming the openings 38 as an implanted mask, the treatment region 42 may be automatically aligned with the source and drain 50.

Figure 3:
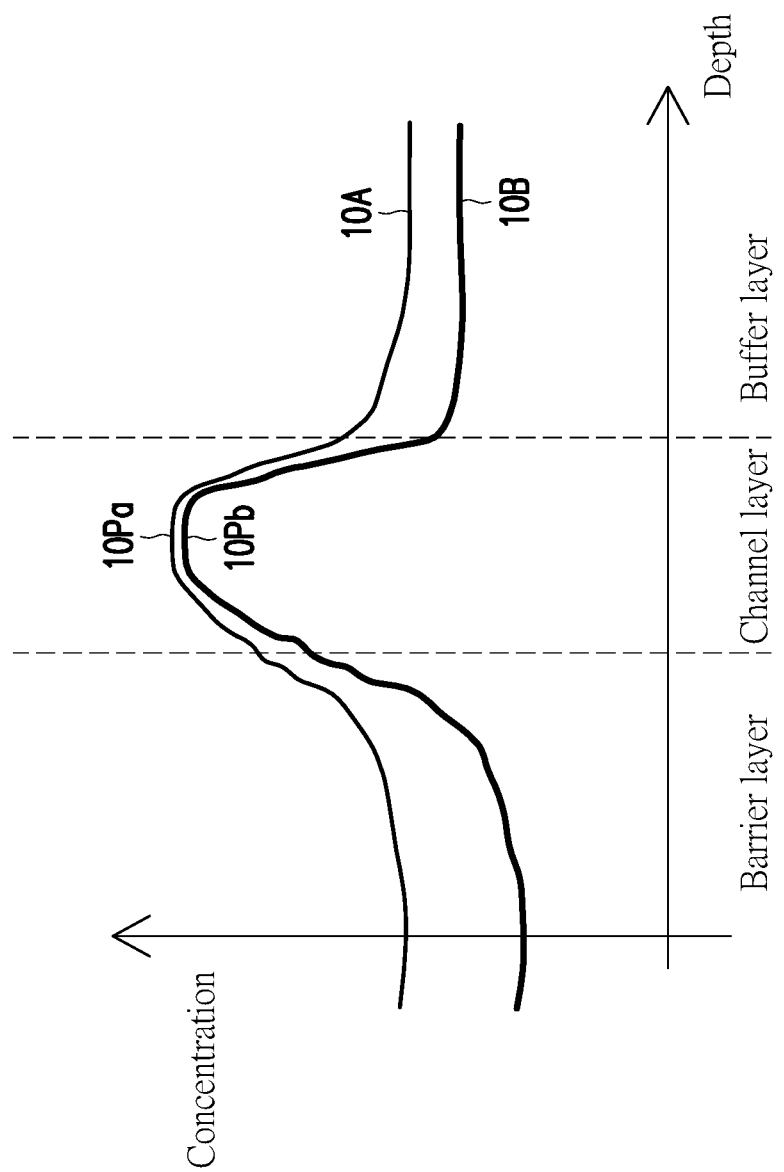
FIG. 3 shows the concentration profile of a treatment region before and after thermal processing.

FIG. 3 shows the concentration profile of a treatment region before and after thermal processing. A curve 10A of the treatment region 42 before the thermal processing is performed is shown. The curve 10A is the damage concentration distribution of the treatment region 42 of FIG. 2D along a depth direction D1.

Referring to FIG. 3, a peak $10P_a$ of the curve 10A of the treatment region 42 before the thermal process is performed is located in the channel layer 16. In some embodiments, the concentration of the peak $10P_a$ is $1\times10^{21}/cm^3$ to $1\times10^{22}/cm^3$. If the thickness T1 (FIG. 1C) of the dielectric layer 28 remaining at the bottom of the openings 38 is too large, or the energy of the ion implantation process of the treatment process 40 is too small, the position of the peak $10P_a$ may be in the barrier layer 18. In contrast, if the thickness T1 (FIG. 1C) of the dielectric layer 28 remaining at the bottom of the openings 38 is too small, or the energy of the ion implantation process of the treatment process 40 is too large, the position of the peak $10P_a$ may be in the buffer layer 14.

Referring to FIG. 2E, using the mask layer 34 as a mask, an etching process is performed to remove the dielectric layer 28 in the treatment region 42. The etching process may be dry etching, wet etching, or a combination thereof. Next, another etching process is performed to remove the barrier layer 18 in the treatment region 42 so that the depth of the openings 38 is increased to the openings 38' and the bottom thereof exposes the channel layer 16 in the treatment region 42. The etching process may be dry etching, wet etching, or a combination thereof.

Referring to FIG. 2F, the mask layer 34 is removed. Removal of the mask layer 34 may be performed by dry removal, wet removal, or a combination thereof. Next, the thermal process 44 is performed to form a treatment region 42'. The thermal process 44 is performed to recrystallize a portion of the treatment region 42 in the channel layer 16 closer to the openings 38' to form a crystalline region 42b, and a portion of the treatment region 42 in the channel layer 16 farther from the openings 38' remains as an amorphous region 42a. In other words, the treatment region 42' includes the amorphous region 42a and the crystalline region 42b.

The amorphous region 42a is extended from at least the top surface of the buffer layer 14 to the substrate 12. In some embodiments, the amorphous region 42a is extended from at least the top surface of the buffer layer 14 to the bottom surface of the buffer layer 14. In other embodiments, the amorphous region 42a is also extended into the channel layer 16.

In some embodiments, an interface 421 exists between the amorphous region 42a and the crystalline region 42b. The interface 421 is located below a heterojunction of the two-dimensional electron gas. The crystalline region 42b is also sandwiched between the heterojunction 20 of the two-dimensional electron gas and the interface 421. The thermal process 44 is, for example, a thermal tempering process. In some embodiments, the thermal process 44 is a rapid thermal tempering process. The gas of the rapid thermal tempering process includes nitrogen, the temperature is, for example, 550 degrees Celsius to 650 degrees Celsius, and the time is, for example, 50 seconds to 70 seconds.

FIG. 3 shows a curve 10B of the treatment region 42' after thermal processing is performed. The curve 10B is the damage concentration distribution of the treatment region 42' of FIG. 2F along the depth direction D1.

A peak $10P_b$ of the curve 10B shown in FIG. 3 is located in the channel layer 16. In some embodiments, the concentration of the peak $10P_b$ is less than $1\times10^{19}/cm^3$. This result shows that the thermal process 44 may form the recrystallized region 42b, so that the damage concentration of the buffer layer 14, the channel layer 16, and the barrier layer 18 is reduced.

Referring to FIG. 2G, a conductor material 46 is formed above the substrate 12. The conductor material 46 covers the dielectric layer 32 and is filled in the openings 38'. The conductor material 46 is, for example, gold, silver, platinum, titanium, aluminum, tungsten, copper, palladium, or a combination thereof. The conductor material 46 includes an ohmic contact metal. The conductor material 46 may be a single layer or a plurality of layers. The conductor material 46 may adopt an electroplating process, a sputtering process, a resistance heating evaporation process, an electron beam evaporation process, a physical vapor deposition (PVD) process, a chemical vapor deposition (CVD) process, or a combination thereof. Then, a mask layer 48 is formed on the conductor material 46. The mask layer 48 is, for example, a patterned photoresist layer. The patterned photoresist layer is formed by exposing and developing a positive photoresist or a negative photoresist.

Referring to FIG. 2H, using the mask layer 48 as a mask, an etching process is performed to remove a portion of the conductor material 46 to form the source and drain 50. So far, the manufacture of the high electron mobility transistor device 60 is completed.

In an embodiment of the invention, the amorphous regions are formed below the channel layer via a treatment process. The amorphous regions are high-resistance region, so the leakage current path may be effectively blocked and the leakage current of the high electron mobility transistor device may be reduced. Moreover, since the amorphous regions adopt the same mask to define the positions thereof as the source and the drain, the amorphous regions may be automatically aligned with the source and the drain.

What is claimed is:

1. A high electron mobility transistor device, comprising:
   a substrate;
   a channel layer located above the substrate;
   a source located on the channel layer;
   a drain located on the channel layer;
   a buffer layer located between the substrate and the channel layer; and
   a plurality of amorphous regions located in the buffer layer below the source and the drain,
   wherein the plurality of amorphous regions are extended from at least a top surface of the buffer layer to a bottom surface of the buffer layer.

2. The high electron mobility transistor device of claim 1, wherein the plurality of amorphous regions are extended from at least a top surface of the buffer layer to the substrate.

3. The high electron mobility transistor device of claim 1, wherein the plurality of amorphous regions are also extended into the channel layer.

4. The high electron mobility transistor device of claim 1, wherein a concentration of the plurality of amorphous regions is less than $1\times10^{19}/cm^3$.

5. The high electron mobility transistor device of claim 1, wherein the channel layer comprises a crystalline region, and there are a plurality of interfaces between the crystalline region directly below the source and the drain and the plurality of amorphous regions.

6. The high electron mobility transistor device of claim 1, further comprising:
   a gate conductor layer located on the channel layer between the source and the drain;
   a barrier layer located between the channel layer and the gate conductor layer; and
   a polarization adjustment layer located between the barrier layer and the gate conductor layer.

7. The high electron mobility transistor device of claim 6, wherein a material of the buffer layer comprises carbon-doped GaN, a material of the channel layer comprises GaN, the barrier layer comprises AlGaN, and the polarization adjustment layer comprises P-type GaN.

* * * * *